(12) United States Patent
Morikazu

(10) Patent No.: US 10,903,087 B2
(45) Date of Patent: Jan. 26, 2021

(54) LASER PROCESSING METHOD

(71) Applicant: DISCO CORPORATION, Tokyo (JP)

(72) Inventor: Hiroshi Morikazu, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/599,809

(22) Filed: Oct. 11, 2019

(65) Prior Publication Data

US 2020/0126810 A1 Apr. 23, 2020

(30) Foreign Application Priority Data

Oct. 23, 2018 (JP) ................................. 2018-199133

(51) Int. Cl.
*H01L 21/42* (2006.01)
*H01L 21/428* (2006.01)

(52) U.S. Cl.
CPC .................................. *H01L 21/428* (2013.01)

(58) Field of Classification Search
CPC . H01L 21/428; H01L 21/76898; B23K 23/57; B23K 26/382
See application file for complete search history.

(56) References Cited

U.S. PATENT DOCUMENTS

| | | | | |
|---|---|---|---|---|
| 7,602,822 B2 * | 10/2009 | Lizotte | ............... | B23K 26/0604 372/6 |
| 7,776,720 B2 * | 8/2010 | Boyle | ..................... | H01L 21/78 438/463 |
| 9,293,409 B2 * | 3/2016 | Fischer | ................. | H01L 23/522 |
| 2007/0045779 A1 * | 3/2007 | Hiatt | ................ | H01L 21/76898 257/621 |
| 2008/0242052 A1 * | 10/2008 | Feng | ................... | H01L 21/3043 438/459 |
| 2013/0288425 A1 * | 10/2013 | Rana | .................... | H01L 31/0682 438/98 |
| 2014/0299367 A1 * | 10/2014 | Imamura | ................ | H05K 1/188 174/260 |

FOREIGN PATENT DOCUMENTS

JP 2013184213 A 9/2013

OTHER PUBLICATIONS

Richard F. Toftness et al., "Laser technology for wafer dicing and micro-via drilling for next generation wafers" Proceedings of SPIE, 5713, Photon Processing in Microelectronics and Photonics IV, Event: Lasers and Applications in Science and Engineering, Apr. 12, 2005 (Year: 2005).*

* cited by examiner

*Primary Examiner* — William Coleman
(74) *Attorney, Agent, or Firm* — Greer Burns & Crain Ltd.

(57) ABSTRACT

A laser processing method for processing a substrate having a device formed on the front side, an electrode pad being formed on the device. The method includes applying a pulsed laser beam to the back side of the substrate at a position corresponding to the electrode pad, thereby forming a fine hole in the substrate so that the fine hole reaches the electrode pad, detecting first plasma light generated from the substrate by the application of the pulsed laser beam to the substrate and also detecting second plasma light generated from the electrode pad by the application of the pulsed laser beam to the electrode pad, and stopping the laser beam when the second plasma light is detected. Time intervals of the pulsed laser beam repeatedly applied to the same fine hole are set to 0.1 ms or more.

2 Claims, 5 Drawing Sheets

LASER PROCESSING METHOD

BACKGROUND OF THE INVENTION

Field of the Invention

The present invention relates to a laser processing method for applying a laser beam to the back side of a substrate to thereby form a fine hole reaching an electrode pad.

Description of the Related Art

A plurality of devices such as integrated circuits (ICs) and large-scale integrated circuits (LSIs) are formed on the front side of a wafer so as to be separated from each other by a plurality of crossing division lines. The wafer thus having the plural devices on the front side is divided along the division lines by using a dicing apparatus or a laser processing apparatus to obtain a plurality of individual device chips. The device chips thus obtained from the wafer are used in various kinds of electrical equipment such as mobile phones and personal computers.

In recent years, the functionality of each device has been increased by the following method. That is, each device is formed on the front side of a substrate, and an electrode pad is formed on the front side of the device. A fine hole is formed through the substrate so as to extend from the back side of the substrate to the back side of the electrode pad. This fine hole is filled with a conductive material such as aluminum to thereby form a via hole. Another device is formed on the back side of the substrate so as to be connected through the via hole to the device formed on the front side of the substrate.

The present applicant has proposed a technique for forming the above fine hole by applying a laser beam to the back side of the substrate at a position corresponding to the electrode pad of each device (see Japanese Patent No. 6034030). In this technique described in Japanese Patent No. 6034030, first plasma light is generated from the substrate by the application of the laser beam to the back side of the substrate having the devices on the front side. Further, second plasma light is also generated from the electrode pad when the laser beam reaches the electrode pad. The first plasma light and the second plasma light are detected to determine whether or not the laser beam has reached the electrode pad. Accordingly, the application of the laser beam to the substrate is stopped without forming a hole in the electrode pad due to the laser beam.

SUMMARY OF THE INVENTION

According to the above conventional technique, the second plasma light inherent to the material forming the electrode pad is generated when the pulsed laser beam applied to the back side of the substrate has reached the electrode pad. Accordingly, when the second plasma light is detected, the application of the laser beam can be stopped. However, in the case that the pulsed laser beam is repeatedly applied at short time intervals (at a high frequency), time is required until the first plasma light inherent to the material forming the substrate completely disappears after the laser beam has reached the electrode pad. Accordingly, the second plasma light generated from the electrode pad cannot be quickly detected. As a result, the laser beam is excessively applied to the electrode pad to cause the formation of a hole in the electrode pad. Thus, there is a problem that it is difficult to properly form the fine hole.

It is therefore an object of the present invention to provide a laser processing method which can properly form a fine hole in a substrate by applying a laser beam to the back side of the substrate at the position corresponding to the electrode pad of each device.

In accordance with an aspect of the present invention, there is provided a laser processing method for processing a substrate by using a pulsed laser beam, the substrate having a front side and a back side, a device having an electrode pad being formed on the front side of the substrate, the pulsed laser beam being applied to the back side of the substrate to thereby form a fine hole reaching the electrode pad. The laser processing method includes a laser beam applying step of applying the pulsed laser beam to the back side of the substrate at a position corresponding to the electrode pad, thereby forming the fine hole in the substrate; a detecting step of detecting first plasma light generated from the substrate by the application of the pulsed laser beam to the substrate and also detecting second plasma light generated from the electrode pad by the application of the pulsed laser beam to the electrode pad; and a laser application ending step of stopping the application of the pulsed laser beam when the second plasma light is detected in the detecting step, and the time intervals of the pulsed laser beam to be repeatedly applied to the same fine hole in the laser beam applying step are set to 0.1 ms or more.

Preferably, the time intervals in the laser beam applying step are set to 0.15 ms or more.

According to the laser processing method of the present invention, the time intervals of the pulsed laser beam to be repeatedly applied to the same fine hole in the laser beam applying step are set to 0.1 ms or more. With this configuration, the second plasma light can be sufficiently detected at the time the fine hole has reached the electrode pad, so that it is possible to solve the problem that a hole is formed in the electrode pad.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
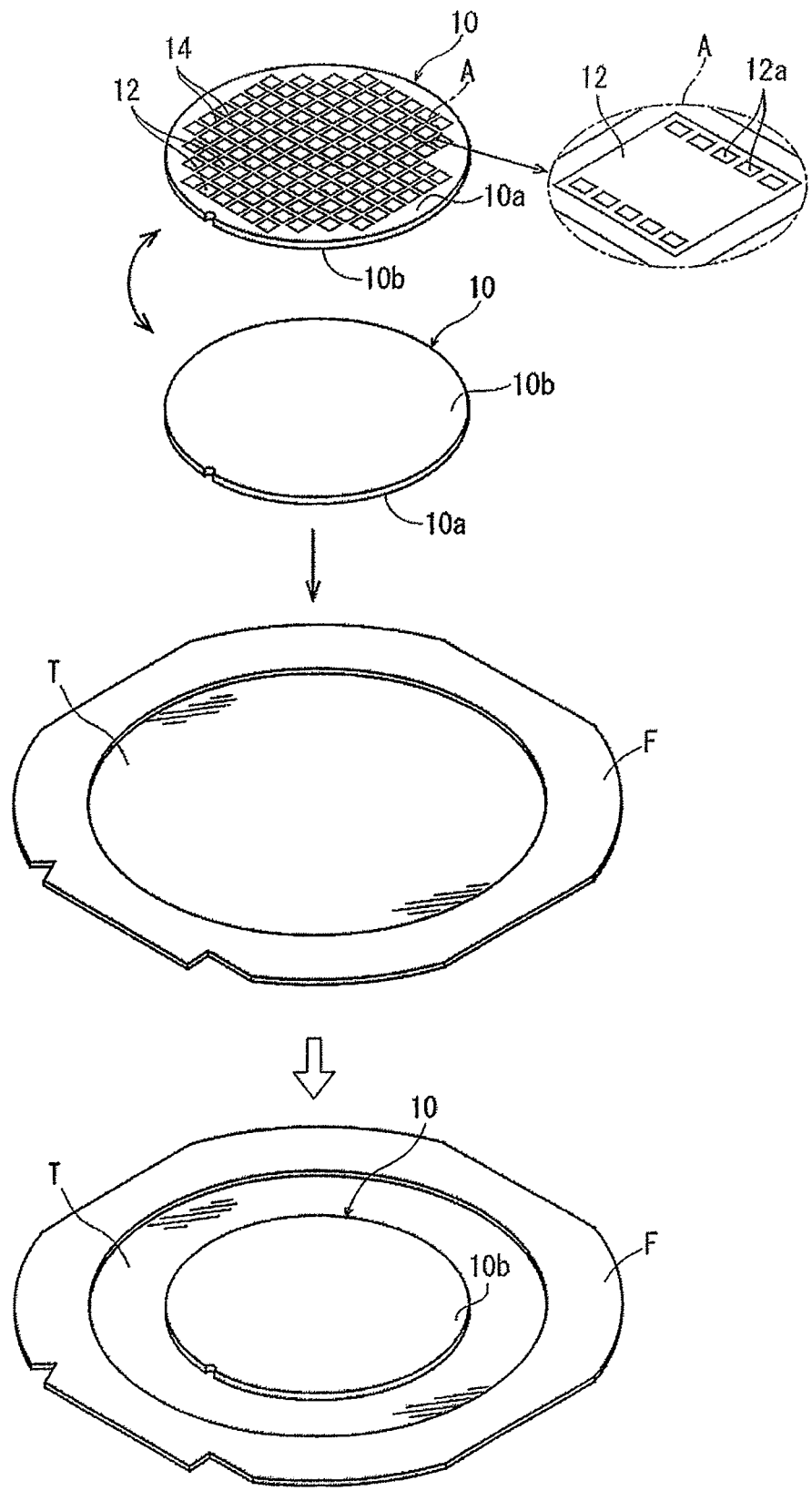
FIG. 1 is a perspective view depicting a substrate as a workpiece and also depicting a manner of supporting the substrate to a ring frame in a preferred embodiment of the present invention.

A laser processing method according to a preferred embodiment of the present invention will now be described in detail with reference to the attached drawings. FIG. 1 is a perspective view of a disk-shaped substrate 10 prepared as a workpiece to be laser-processed in this preferred embodiment. The substrate 10 depicted in FIG. 1 is formed of lithium tantalate (LT) and has a thickness of 300 fÊm, for example. The substrate 10 has a front side 10a and a back side 10b. A plurality of crossing division lines 14 are formed on the front side 10a of the substrate 10 to thereby define a plurality of separate regions where a plurality of devices 12 are respectively formed. As depicted in an enlarged part A on the right side in FIG. 1, a plurality of (ten) electrode pads 12a are formed on the front side of each device 12. Each electrode pad 12a has a substantially rectangular shape. In this preferred embodiment, five electrode pads 12a are arranged in a line along one side edge of each device 12, and five electrode pads 12a are arranged in a line along another side edge of each device 12 parallel to the one side edge. Each electrode pad 12a has a size of approximately 500×600 µm. Each electrode pad 12a is formed of copper (Cu), for example. As depicted in FIG. 1, the prepared substrate 10 is inverted, and the front side 10a of the substrate 10 is attached to a protective tape (adhesive tape) T supported in its peripheral portion to a ring frame F. That is, the substrate 10 is supported through the protective tape T to the ring frame F in the condition where the back side 10b of the substrate 10 is oriented upward, or exposed upward.

Figure 2:
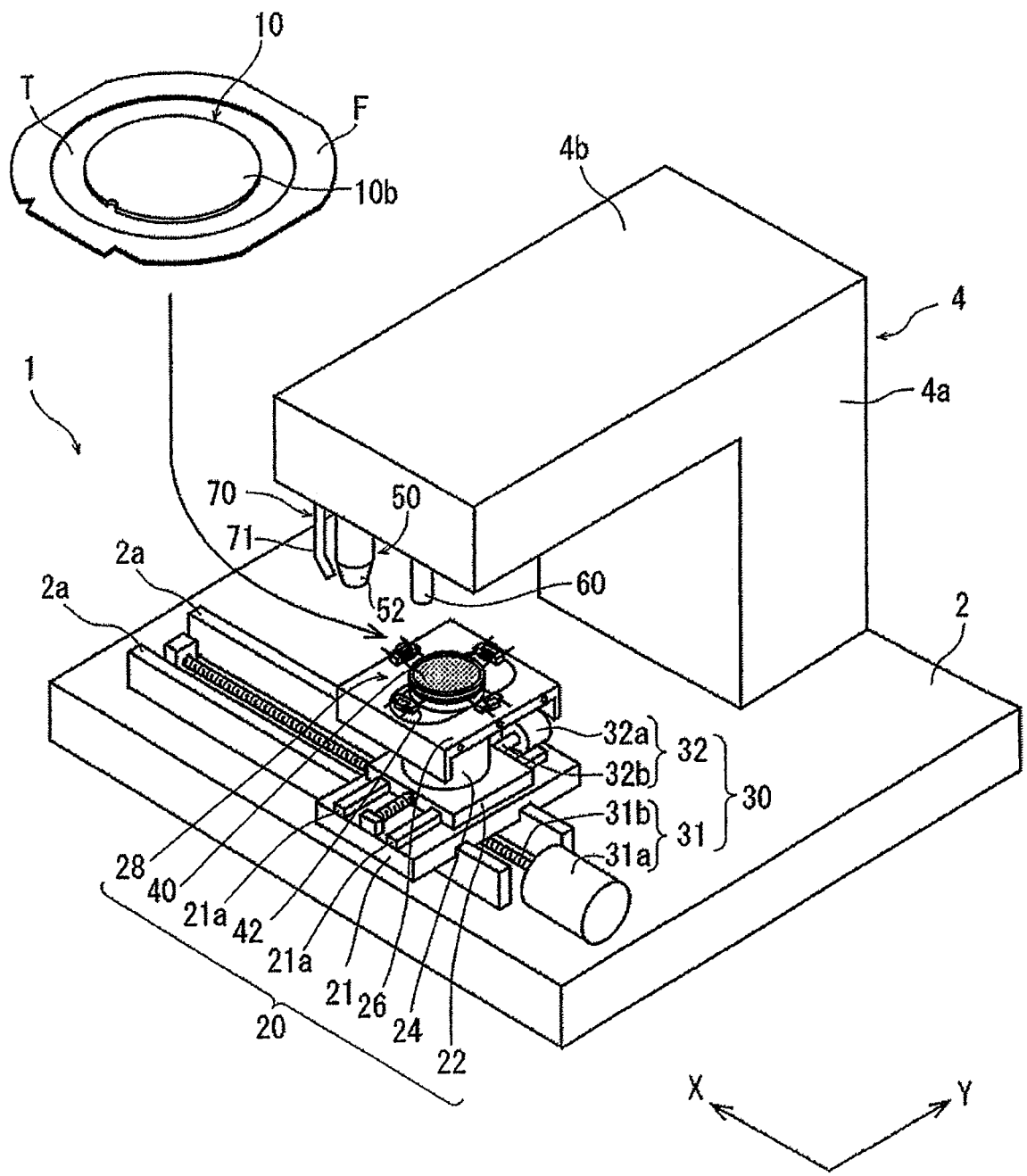
FIG. 2 is an overall perspective view of a laser processing apparatus for performing laser processing to the substrate depicted in FIG. 1.

FIG. 2 is an overall perspective view of a laser processing apparatus 1 for performing laser processing to the substrate 10 so as to form a fine hole corresponding to each electrode pad 12a in the present embodiment. The laser processing apparatus 1 depicted in FIG. 2 includes a holding unit 20 for holding the substrate 10 supported through the protective tape T to the ring frame F, a moving mechanism 30 for moving the holding unit 20, a laser beam applying unit 50 for applying a laser beam to the substrate 10 held by the holding unit 20, an imaging unit 60 for imaging the substrate 10 held by the holding unit 20, and plasma light detecting means 70 for detecting plasma light generated from the substrate 10.

The laser processing apparatus 1 has a base 2. The holding unit 20 includes a rectangular X movable plate 21 mounted on the base 2 so as to be movable in the X direction depicted by an arrow X in FIG. 2, a rectangular Y movable plate 22 mounted on the X movable plate 21 so as to be movable in the Y direction depicted by an arrow Y in FIG. 2, a cylindrical support column 24 fixed to an upper surface of the Y movable plate 22, and a rectangular cover plate 26 fixed to an upper end of the support column 24. The X direction and the Y direction are perpendicular to each other in a substantially horizontal plane. The cover plate 26 has an elongated hole 26a, and a circular chuck table 28 is provided on the cover plate 26 so as to extend upward through the elongated hole 26a of the cover plate 26. The chuck table 28 has an upper surface for holding the substrate 10. The upper surface of the chuck table 28 is provided with a circular vacuum chuck 40 formed of a porous material. The vacuum chuck 40 has a substantially horizontal upper surface for holding the substrate 10 under suction. That is, the vacuum chuck 40 is connected through a suction passage (not depicted) to suction means (not depicted) for producing a vacuum. The suction passage is formed inside the support column 24. The chuck table 28 is provided with a plurality of clamps 42 for fixing the ring frame F supporting the substrate 10.

The moving mechanism 30 is provided on the base 2 and functions as means for relatively moving the holding unit 20 and the laser beam applying unit 50. The moving mechanism 30 includes an X moving mechanism 31 for moving the holding unit 20 in the X direction as a feeding direction and a Y moving mechanism 32 for moving the holding unit 20 in the Y direction as an indexing direction. The X moving mechanism 31 includes a pulse motor 31a and a ball screw 31b adapted to be rotated by the pulse motor 31a, where a rotary motion by the pulse motor 31a is converted into a linear motion by the ball screw 31b and then transmitted to the X movable plate 21. Accordingly, the X movable plate 21 can be moved back and forth in the X direction along a pair of parallel guide rails 2a provided on the base 2, where the guide rails 2a are slidably engaged with a pair of parallel grooves formed on the lower surface of the X movable plate 21. Similarly, the Y moving mechanism 32 includes a pulse motor 32a and a ball screw 32b adapted to be rotated by the pulse motor 32a, where a rotary motion by the pulse motor 32a is converted into a linear motion by the ball screw 32b and then transmitted to the Y movable plate 22. Accordingly, the Y movable plate 22 can be moved back and forth in the Y direction along a pair of parallel guide rails 21a provided on the upper surface of the X movable plate 21, where the guide rails 21a are slidably engaged with a pair of parallel grooves formed on the lower surface of the Y movable plate 22. Further, rotational driving means (not depicted) for rotating the chuck table 28 is provided inside the support column 24. Accordingly, the chuck table 28 can be rotated by a given angle by this rotational driving means. Although not depicted, the X moving mechanism 31, the Y moving mechanism 32, and the rotational driving means are respectively provided with X position detecting means for detecting the X position of the chuck table 28 in the X direction, Y position detecting means for detecting the Y position of the chuck table 28 in the Y direction, and rotational position detecting means for detecting the rotational position of the chuck table 28. Thus, the X position, Y position, and rotational position of the chuck table 28 on the base 2 can be accurately detected by these position detecting means. Detection signals from these position detecting means are transmitted to a control unit 100 (see FIG. 3) which will be hereinafter described. According to a control signal transmitted from the control unit 100, all of the X moving mechanism 31, the Y moving mechanism 32, and the rotational driving means are operated to control the chuck table 28 so as to obtain a desired X coordinate position, desired Y coordinate position, and desired rotational angle θ.

An inverted L-shaped support member 4 is provided on the base 2 at a rear portion behind the moving mechanism 30. The support member 4 includes a vertical portion 4a extending vertically upward from an upper surface of the base 2 and a horizontal portion 4b extending horizontally from an upper end of the vertical portion 4a. The laser beam applying unit 50 includes an optical system (not depicted) provided in the horizontal portion 4b of the support member 4. The laser beam applying unit 50 further includes focusing means 52 provided on a lower surface of a front end portion of the horizontal portion 4b.

Figure 3:
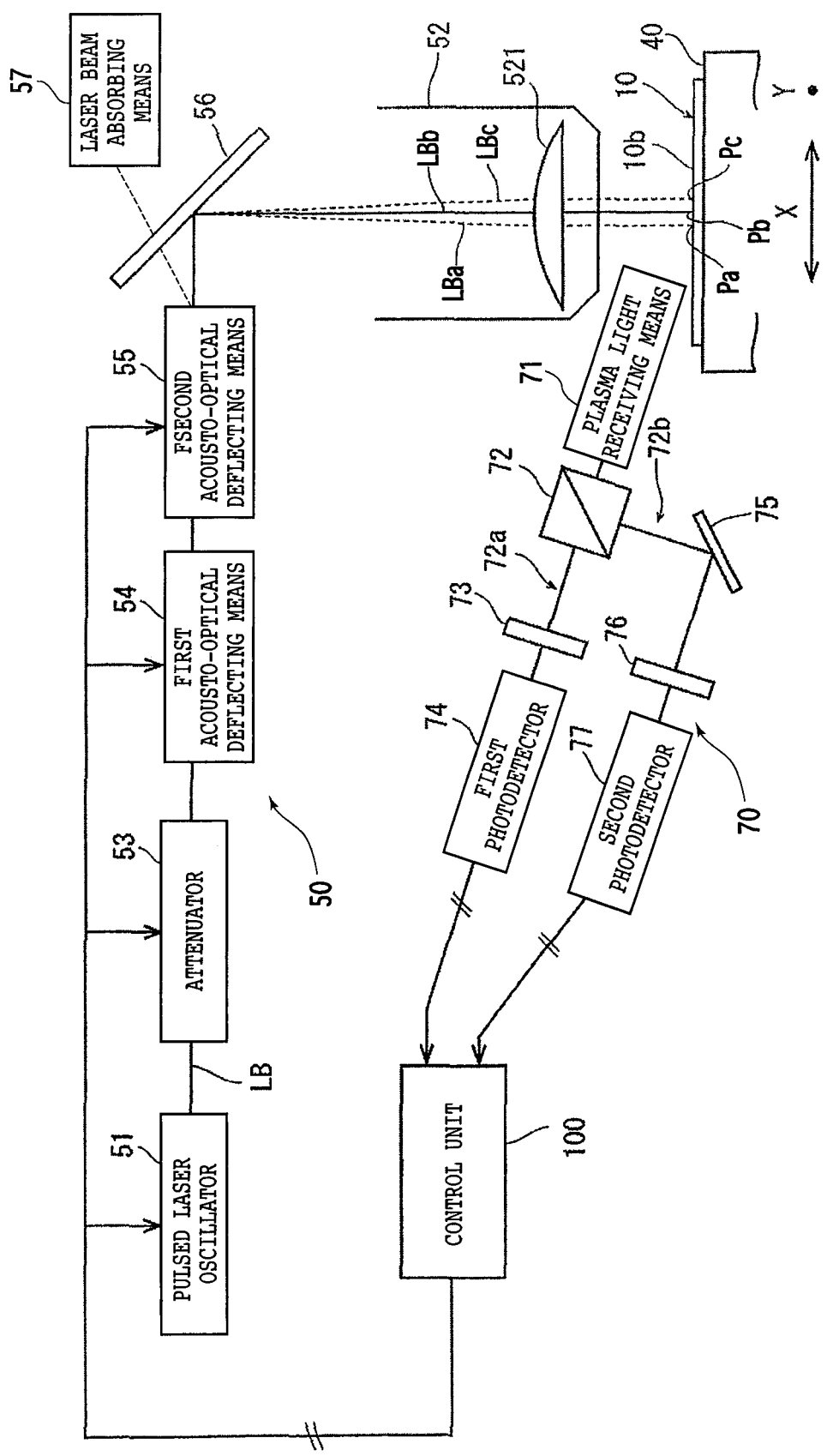
FIG. 3 is a block diagram depicting a laser beam applying unit and plasma light detecting means included in the laser processing apparatus depicted in FIG. 2.

As depicted in FIG. 3, the optical system of the laser beam applying unit 50 includes a pulsed laser oscillator 51 for generating a pulsed laser and emitting a pulsed laser beam LB, an attenuator 53 for adjusting the power of the laser beam LB emitted from the pulsed laser oscillator 51, first acoustooptic deflecting means 54 essentially including an acoustooptic device as optical deflecting means for deflecting the optical path of the laser beam LB in a given feeding direction (X direction), second acoustooptic deflecting means 55 essentially including an acoustooptic device as optical deflecting means for deflecting the optical path of the laser beam LB in a given indexing direction (Y direction), and a reflecting mirror 56 for changing the direction of the optical path of the laser beam LB emerged from the second acoustooptic deflecting means 55. The optical path of the laser beam LB reflected from the reflecting mirror 56 is guided into the focusing means or a condenser 52 including an fθ lens 521. All of the pulsed laser oscillator 51, the attenuator 53, the first acoustooptic deflecting means 54, and the second acoustooptic deflecting means 55 are connected to the control unit 100, and the operation of these components is controlled by control signals transmitted from the control unit 100.

In the case where a voltage of 5 V, for example, is applied from the control unit 100 to the first acoustooptic deflecting means 54 and a frequency corresponding to 5 V is applied to the acoustooptic device (not depicted) included therein, the laser beam LB generated from the pulsed laser oscillator 51 is deflected in its optical path as depicted by LBa in FIG. 3 and the laser beam LB is focused at a point Pa. Further, in the case where a voltage of 10 V, for example, is applied from the control unit 100 to the first acoustooptic deflecting means 54 and a frequency corresponding to 10 V is applied to the acoustooptic device included therein, the laser beam LB generated from the pulsed laser oscillator 51 is deflected in its optical path as depicted by LBb in FIG. 3 and the laser beam LB is focused at a point Pb displaced from the point Pa to the right as viewed in FIG. 3 by a predetermined amount. Further, in the case where a voltage of 15 V, for example, is applied from the control unit 100 to the first acoustooptic deflecting means 54 and a frequency corresponding to 15 V is applied to the acoustooptic device included therein, the laser beam LB generated from the pulsed laser oscillator 51 is deflected in its optical path as depicted by LBc in FIG. 3 and the laser beam LB is focused at a point Pc displaced from the point Pb to the right as viewed in FIG. 3 by a predetermined amount. The first acoustooptic deflecting means 54 deflects the optical path of the laser beam LB in the feeding direction (X direction parallel to the sheet of FIG. 3).

In contrast, the second acoustooptic deflecting means 55 deflects the optical path of the laser beam LB in the indexing direction (Y direction perpendicular to the sheet of FIG. 3). The other configuration is similar to that of the first acoustooptic deflecting means 54. Thus, the optical path of the laser beam LB can be deflected in the feeding direction (X direction) to a given position in a predetermined range by the first acoustooptic deflecting means 54 according to a voltage applied thereto. Similarly, the optical path of the laser beam LB can be also deflected in the indexing direction (Y direction) to a given position in a predetermined range by the second acoustooptic deflecting means 55 according to a voltage applied thereto. As depicted in FIG. 3, the laser beam applying unit 50 further includes laser beam absorbing means 57 for absorbing a laser beam LB' (depicted by a broken line) deflected by the second acoustooptic deflecting means 55 in the case where a predetermined voltage is applied thereto.

The control unit 100 is configured by a computer, which includes a central processing unit (CPU) for computing according to a control program, a read only memory (ROM) previously storing, for example, the control program, a random access memory (RAM) for storing, for example, detection values and computation results, an input interface, and an output interface. Not only the laser beam applying unit 50 is connected to the control unit 100, but also the moving mechanism 30, the imaging unit 60, the plasma light detecting means 70, and the like are connected to the control unit 100, and these components can be controlled by control signals transmitted from the control unit 100.

Referring back to FIG. 2, the imaging unit 60 is provided on the lower surface of the front end portion of the horizontal portion 4b at a position adjacent to the focusing means 52 in the X direction. The imaging unit 60 includes an ordinary imaging device for imaging the workpiece by using visible light, illuminating means for illuminating the workpiece, an infrared imaging device for imaging the workpiece by using infrared light, infrared light applying means for applying infrared light to the workpiece, and the like. Information on an image obtained by the imaging unit 60 is transmitted to the control unit 100. The imaging unit 60 is used in performing alignment between the substrate 10 and the focusing means 52 and also used in detecting the position of each electrode pad 12a formed on each device 12.

The plasma light detecting means 70 has an optical system provided in the horizontal portion 4b of the support member 4. As depicted in FIG. 2, plasma light receiving means 71 as a component of the plasma light detecting means 70 is provided on the lower surface of the front end portion of the horizontal portion 4b at a position adjacent to the focusing means 52 in the X direction and opposite to the imaging unit 60. As depicted in FIG. 3, the plasma light detecting means 70 includes the plasma light receiving means 71 as mentioned above. The plasma light receiving means 71 functions to receive plasma light generated from the substrate 10 by the application of the laser beam LB from the focusing means 52 of the laser beam applying unit 50 to the substrate 10 held on the vacuum chuck 40 of the chuck table 28. The plasma light detecting means 70 further includes a beam splitter 72 for dividing the plasma light received by the plasma light receiving means 71 into light having a first optical path 72a and light having a second optical path 72b, a first bandpass filter 73 provided on the first optical path 72a for passing only the light having a first preset wavelength (i.e., the wavelength of first plasma light generated from lithium tantalate forming the substrate 10), a first photodetector 74 for detecting the light passed through the first bandpass filter 73 and outputting a light intensity signal, a direction changing mirror 75 provided on the second optical path 72b, a second bandpass filter 76 for receiving the light changed in traveling direction by the direction changing mirror 75 and passing only the light having a second preset wavelength (i.e., the wavelength of second plasma light generated from copper forming each electrode pad 12a), and a second photodetector 77 for detecting the light passed through the second bandpass filter 76 and outputting a light intensity signal. The plasma light receiving means 71 is composed of a focusing lens and a lens case for storing the focusing lens (both of which are not depicted).

The first bandpass filter 73 has a passband of 600 to 680 nm in wavelength, so as to pass only the first plasma light having a specific wavelength (670 nm) generated from lithium tantalate, in the present embodiment. On the other hand, the second bandpass filter 76 has a passband of 510 to 520 nm in wavelength, so as to pass only the second plasma light having a specific wavelength (515 nm) generated from copper, in the present embodiment. Each of the first photodetector 74 and the second photodetector 77 outputs to the control unit 100 a voltage signal corresponding to the light intensity detected.

By using the laser processing apparatus 1 having the above configuration in the present embodiment, a laser processing operation is performed to form a fine hole in the substrate 10 at a position corresponding to each electrode pad 12a formed on each device 12 formed on the front side 10a of the substrate 10, the fine hole having a depth from the back side 10b of the substrate 10 to the corresponding electrode pad 12a.

As described above, the substrate 10 is supported through the protective tape T to the ring frame F in the condition where the back side 10b of the substrate 10 is oriented upward. First, the substrate 10 is placed through the protective tape T on the vacuum chuck 40 of the chuck table 28 in the laser processing apparatus 1 depicted in FIG. 2 in the condition where the back side 10b of the substrate 10 is oriented upward. Thereafter, the suction means (not depicted) connected to the vacuum chuck 40 is operated to hold under suction the substrate 10 through the protective tape T on the vacuum chuck 40. Further, the ring frame F is fixed by the clamps 42.

Thereafter, the chuck table 28 holding the substrate 10 under suction is moved to a position directly below the imaging unit 60 by operating the X moving mechanism 31. Thereafter, the imaging unit 60 is operated to determine whether or not the crossing division lines 14 formed on the substrate 10 held on the chuck table 28 are parallel to the X direction and the Y direction. According to this determination, the orientation of the substrate 10 is adjusted by suitably rotating the chuck table 28. Thereafter, the coordinate position of each electrode pad 12a formed on each device 12 is detected and the alignment is performed to set the laser application position where the laser beam LB is to be applied to the substrate 10.

After performing the alignment, a laser beam applying step is performed to apply the laser beam LB to the back side 10b of the substrate 10 at the position corresponding to each electrode pad 12a.

Laser Beam Applying Step

As described above, the laser beam applying step is performed after performing the alignment. The coordinate position of each device 12 formed on the substrate 10 held on the chuck table 28 and the coordinate position of each electrode pad 12a formed on each device 12 are stored and managed in the control unit 100. Accordingly, by performing the alignment, each electrode pad 12a on the substrate 10 can be accurately set to a given position.

For example, the laser processing operation in this preferred embodiment may be performed under the following conditions.

Wavelength of the laser beam: 343 nm
Repetition frequency: 50 kHz
Average power: 2 W
Pulse energy: 40 μJ
Pulse width: 10 μs
Spot diameter: 50 μm In performing the laser processing operation under the above conditions, the laser beam LB is applied to the substrate 10 at time intervals of 0.1 ms or more by performing the following method. As mentioned above, the repetition frequency of the laser beam LB to be generated from the pulsed laser oscillator 51 is set to 50 kHz. With this setting, the laser beam LB is generated at time intervals of 0.02 ms.

Figure 4:
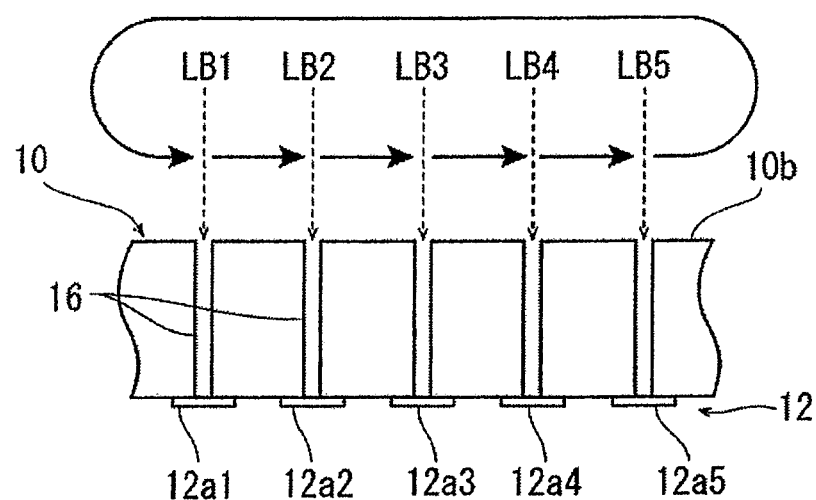
FIG. 4 is an enlarged sectional view of an essential part of the substrate, illustrating a manner of applying a laser beam to the back side of the substrate to form fine holes reaching electrode pads formed on the front side of a device in a laser beam applying step.

By suitably controlling the first acoustooptic deflecting means 54 and the second acoustooptic deflecting means 55 in this setting, the laser beam LB is dispersively applied to the back side 10b of the substrate 10 in such a manner that the application positions of five pulses LB1 to LB5 of the laser beam LB are changed so as to respectively correspond to five electrode pads 12a1 to 12a5 arranged adjacently in a line, as depicted in FIG. 4. This operation is repeated to form five fine holes 16 and obtain the result that the laser beam LB generated at time intervals of 0.02 ms is applied to the same fine hole 16 at time intervals of 0.1 ms. According to this preferred embodiment, the time intervals of the laser beam LB to be applied to the substrate 10 are increased, so that it is unnecessary to generate a wasted laser beam LB' to be absorbed by the laser beam absorbing means 57. Further, the plural fine holes 16 can be formed at one time, providing excellent machining efficiency.

Detecting Step

In performing the laser beam applying step, a detecting step is performed to detect the first plasma light generated from lithium tantalate forming the substrate 10 and the second plasma light generated from copper forming each electrode pad 12a. This detecting step will now be described.

Figure 5:
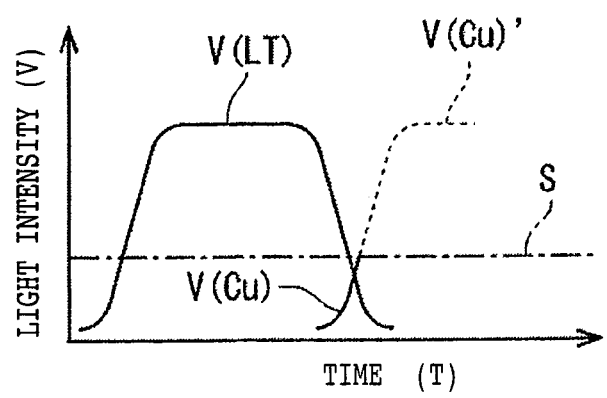
FIG. 5 is a graph depicting a change in output (voltage value) from a first photodetector and a second photodetector depicted in FIG. 3.

In the detecting step, light intensity signals as voltage values are output from the first photodetector 74 and the second photodetector 77 of the plasma light detecting means 70 to the control unit 100 in the condition where the laser beam applying step is being performed. FIG. 5 depicts a change in voltage value V(LT) and a change in voltage value V(Cu) with time elapsed, where the voltage value V(LT) is a voltage value output from the first photodetector 74 for detecting the light intensity of the first plasma light, and the voltage value V(Cu) is a voltage value output from the second photodetector 77 for detecting the light intensity of the second plasma light. In FIG. 5, the horizontal axis represents time (T), and the vertical axis represents voltage value (V) corresponding to light intensity.

When the laser beam LB starts to be applied to the back side 10b of the substrate 10 at the position corresponding to each electrode pad 12a, the first plasma light is generated from the substrate 10 due to the application of the laser beam LB. Accordingly, as depicted in FIG. 5, the voltage value V(LT) output from the first photodetector 74 starts to increase until a predetermined voltage value (e.g., 2.5 V) is reached. Thereafter, until the laser beam LB reaches each electrode pad 12a, the voltage value V(LT) is kept at a substantially constant value. When the laser beam LB reaches each electrode pad 12a, the voltage value V(LT) output from the first photodetector 74 starts to decrease.

Laser Application Ending Step

By performing the detecting step, the condition of generation of the first plasma light and the second plasma light can be detected. That is, in performing the detecting step, a laser application ending step is performed to detect the second plasma light, thereby stopping the application of the laser beam LB. This laser application ending step will now be described in more detail.

When the laser beam LB reaches the electrode pads 12a1 to 12a5, the voltage value V(Cu) output from the second photodetector 77 starts to increase as depicted in FIG. 5. However, just after the voltage value V(Cu) has increased, the fine holes 16 may not sufficiently reach the electrode pads 12a1 to 12a5, so that there is a possibility that poor conduction may occur after the fine holes 16 are filled with a conductive material. To cope with this problem, a threshold value S (e.g., 1.0 V) is set for the voltage value V(Cu) to be output from the second photodetector 77, so as to detect that the fine holes 16 have sufficiently reached the electrode pads 12a1 to 12a5. The voltage value V(Cu) output from the second photodetector 77 is compared with this threshold value S. When the voltage value V(Cu) has become larger than the threshold value S, it is determined that the fine holes 16 have sufficiently reached the electrode pads 12a1 to 12a5, that is, it is determined that the fine holes 16 have been properly formed in the substrate 10. As a result, the control unit 100 outputs a stop signal to the laser beam applying unit 50, thereby ending the application of the laser beam LB. If the above determination using the threshold value S is not performed and the laser beam applying step is continued even after the voltage value V(Cu) becomes larger than the threshold value S, the voltage value V(Cu) further increases as depicted by a broken line V(Cu)' in FIG. 5 until a substantially constant electrode value (e.g., 2.5 V) is reached. However, if the voltage value V(Cu) becomes such a constant electrode value, there is a possibility that a through hole may be formed in each of the electrode pads 12a1 to 12a5. Accordingly, the threshold value S is set to a value smaller than the above constant value.

As describe above, the laser beam applying step, the detecting step, and the laser application ending step are performed while moving the chuck table 28 in the X direction by operating the X moving mechanism 31, thereby forming the proper fine holes 16 extending from the back side 10b of the substrate 10 to the five electrode pads 12a1 to 12a5, respectively. Thereafter, the chuck table 28 is moved in the X direction so that the five electrode pads 12a on the next device 12 adjacent to the present device 12 in the X direction are positioned directly below the focusing means 52. When the five electrode pads 12a on the next device 12 are positioned directly below the focusing means 52, the laser beam applying step, the detecting step, and the laser application ending step are similarly performed to the five electrode pads 12a on this next device 12. This operation is repeated to thereby form a plurality of proper fine holes 16 respectively corresponding to all the electrode pads 12a arranged in a line in the X direction. Thereafter, the Y moving mechanism 32 is operated to move (index) the substrate 10 in the Y direction by the pitch of the division lines 14, so that the five electrode pads 12a on the next device 12 adjacent to the present device 12 in the Y direction are positioned directly below the focusing means 52. Thereafter, the laser processing is similarly performed to the five electrode pads 12a on the next device 12, and this operation is repeated to thereby form a plurality of proper fine holes 16 respectively corresponding to all the electrode pads 12a of all the devices 12 formed on the front side 10a of the substrate 10.

As described above, in the present embodiment, the repetition frequency of the laser beam LB to be generated from the pulsed laser oscillator 51 is set to 50 kHz, that is, the pulsed laser beam LB is generated at time intervals of 0.02 ms. Then, this laser beam LB is dispersively applied to the substrate 10, so that the laser beam LB is applied to the same fine hole 16 at time intervals of 0.1 ms. This is based on the finding that the time intervals of the laser beam to be applied to the same fine hole 16 must be set to 0.1 ms or more, and this finding constitutes the technical idea of the present invention. The reason for setting the above-mentioned time intervals as the conditions for laser processing will now be described.

The present inventors conducted tests for examination of the time intervals of the laser beam LB to be applied to the same fine hole 16 in applying the laser beam LB to the back side 10b of the substrate 10 at the positions corresponding to the electrode pads 12a to form the proper fine holes 16 reaching the electrode pads 12a. This test will now be described with reference to FIG. 3 and FIGS. 6A to 6H. FIGS. 6A to 6H depict various examples of the signal pulses of the laser beam LB applied to the back side 10b of the substrate 10 at the position corresponding to one of the electrode pads 12a by operating the laser beam applying unit 50. More specifically, the pulses of the laser beam LB actually applied to the substrate 10 are depicted by solid lines in FIGS. 6A to 6H, whereas the pulses of the laser beam LB' (see FIG. 3) deflected from the optical path by the second acoustooptic deflecting means 55 and absorbed to be skipped by the laser beam absorbing means 57 are depicted by broken lines in FIGS. 6A to 6H. In the following examples of the test, the processing conditions other than a parameter specified to be changed are similar to those in the above preferred embodiment, and the description of such similar conditions will be omitted herein.

The laser processing conditions in the following examples of the test are basically as follows:
Wavelength of the pulsed laser beam: 343 nm
Repetition frequency: 50 kHz (reference repetition frequency)
Average power: 2 W
Pulse energy: 40 µJ
Pulse width: 10 µs
Spot diameter: 50 µm

Example 1

Figure 6A:
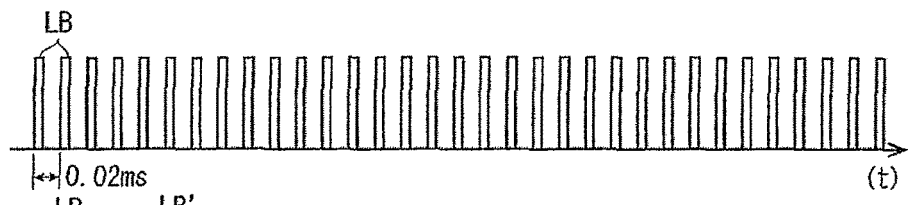
FIGS. 6A to 6H are waveform charts depicting the pulses of a laser beam applied in tests conducted by the present inventors.

As depicted in FIG. 6A, the reference repetition frequency (50 kHz: 0.02 ms as the time intervals of the laser beam LB) in the above laser processing conditions was used without any change to perform laser processing, thereby forming a fine hole 16 at the position corresponding to one of the electrode pads 12a. In this laser processing, the second plasma light was detected to stop the application of the laser beam LB. As a result, a hole was formed through the electrode pad 12a.

Example 2

Figure 6B:
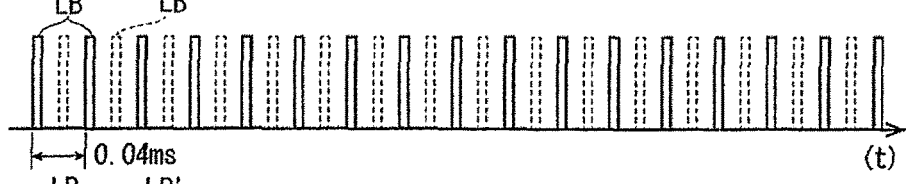

As depicted in FIG. 6B, of the laser beam LB having the reference repetition frequency (50 kHz) in the above laser processing conditions, the even-numbered pulses were skipped, that is, every one pulse was skipped. In other words, the repetition frequency was substantially changed to 25 kHz (0.04 ms as the time intervals of the laser beam LB). Under the conditions changed above, laser processing was performed to form a fine hole 16 at the position corresponding to one of the electrode pads 12a. In this laser processing, the second plasma light was detected to stop the application of the laser beam LB. As a result, a hole was formed through the electrode pad 12a.

Example 3

Figure 6C:
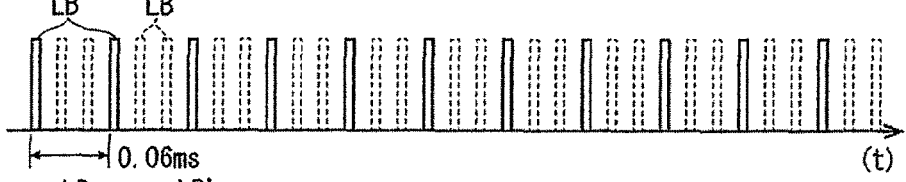

As depicted in FIG. 6C, of the laser beam LB having the reference repetition frequency (50 kHz) in the above laser processing conditions, every two pulses were skipped. In other words, the repetition frequency was substantially changed to 16.7 kHz (0.06 ms as the time intervals of the laser beam LB). Under the conditions changed above, laser processing was performed to form a fine hole 16 at the position corresponding to one of the electrode pads 12a. In this laser processing, the second plasma light was detected to stop the application of the laser beam LB. As a result, a hole was formed through the electrode pad 12a.

Example 4

Figure 6D:
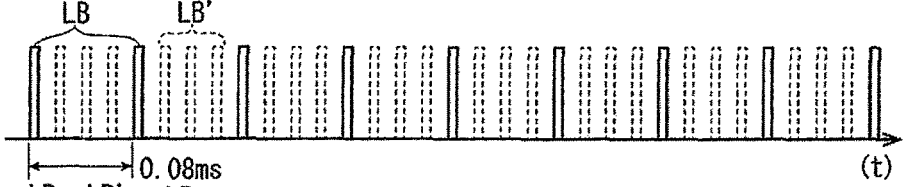

As depicted in FIG. 6D, of the laser beam LB having the reference repetition frequency (50 kHz) in the above laser processing conditions, every three pulses were skipped. In other words, the repetition frequency was substantially changed to 12.5 kHz (0.08 ms as the time intervals of the laser beam LB). Under the conditions changed above, laser processing was performed to form a fine hole 16 at the position corresponding to one of the electrode pads 12a. In this laser processing, the second plasma light was detected to stop the application of the laser beam LB. As a result, a hole was slightly formed in the electrode pad 12a.

Example 5

Figure 6E:
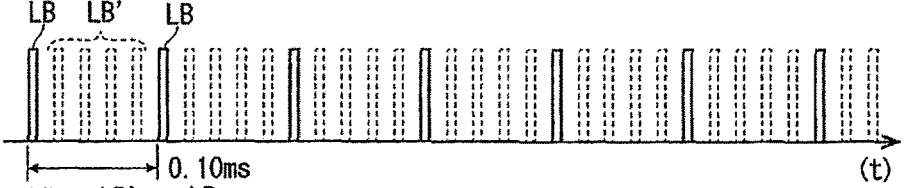

As depicted in FIG. 6E, of the laser beam LB having the reference repetition frequency (50 kHz) in the above laser processing conditions, every four pulses were skipped. In other words, the repetition frequency was substantially changed to 10 kHz (0.1 ms as the time intervals of the laser beam LB). Under the conditions changed above, laser processing was performed to form a fine hole 16 at the position corresponding to one of the electrode pads 12a. In this laser processing, the second plasma light was detected to stop the application of the laser beam LB. As a result, a recess was observed on the back side of the electrode pad 12a, but no hole was formed in the electrode pad 12a.

Example 6

Figure 6F:
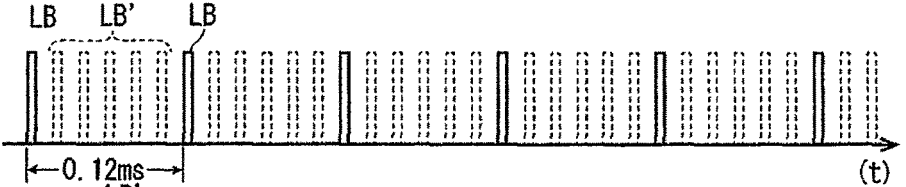

As depicted in FIG. 6F, of the laser beam LB having the reference repetition frequency (50 kHz) in the above laser processing conditions, every five pulses were skipped. In other words, the repetition frequency was substantially changed to 8.3 kHz (0.12 ms as the time intervals of the laser beam LB). Under the conditions changed above, laser processing was performed to form a fine hole 16 at the position corresponding to one of the electrode pads 12a. In this laser processing, the second plasma light was detected to stop the application of the laser beam LB. As a result, a recess was observed on the back side of the electrode pad 12a, but no hole was formed in the electrode pad 12a.

Example 7

Figure 6G:
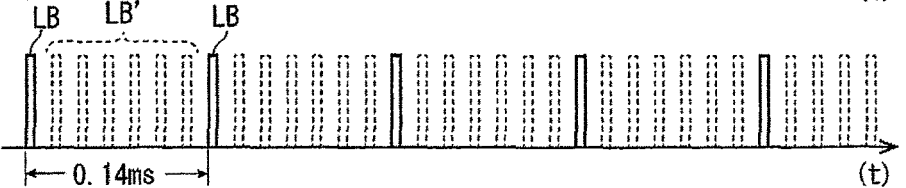

As depicted in FIG. 6G, of the laser beam LB having the reference repetition frequency (50 kHz) in the above laser processing conditions, every six pulses were skipped. In other words, the repetition frequency was substantially changed to 7.1 kHz (0.14 ms as the time intervals of the laser beam LB). Under the conditions changed above, laser processing was performed to form a fine hole 16 at the position corresponding to one of the electrode pads 12a. In this laser processing, the second plasma light was detected to stop the application of the laser beam LB. As a result, a slight recess was observed on the back side of the electrode pad 12a, but no hole was formed in the electrode pad 12a.

Example 8

Figure 6H:
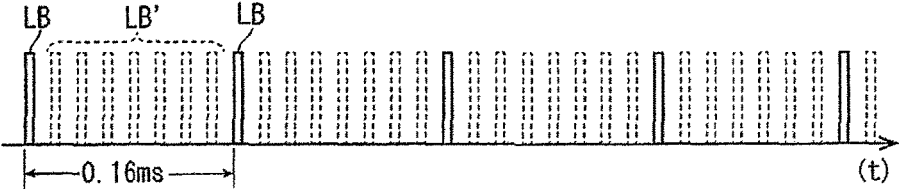

As depicted in FIG. 6H, of the laser beam LB having the reference repetition frequency (50 kHz) in the above laser processing conditions, every seven pulses were skipped. In other words, the repetition frequency was substantially changed to 6.25 kHz (0.16 ms as the time intervals of the laser beam LB). Under the conditions changed above, laser processing was performed to form a fine hole 16 at the position corresponding to one of the electrode pads 12a. In this laser processing, the second plasma light was detected to stop the application of the laser beam LB. As a result, no hole was formed in the electrode pad 12a, and no recess was observed on the back side of the electrode pad 12a.

CONCLUSION

From the results of the above tests, the present inventors found out that when the substantial repetition frequency of the laser beam LB to be generated by the pulsed laser oscillator 51 is set to 10 kHz or less, that is, when the time intervals of the laser beam LB to be applied to the same fine hole 16 are set to 0.1 ms or more, the second plasma light can be sufficiently detected at the time the fine hole 16 has reached the electrode pad 12a, so that it is possible to solve the problem that a hole is formed in the electrode pad 12a. Further, the present inventors also found out that by setting the time intervals of the laser beam LB to 0.15 ms or more, the detection of the second plasma light can be effected without forming a large recess in the electrode pad 12a, so that it can be properly determined that the fine hole 16 has reached the electrode pad 12a. That is, in the laser beam applying step, it is more preferable to set the time intervals of the pulsed laser beam LB to 0.15 ms or more.

In the above preferred embodiment, the repetition frequency of the pulsed laser beam LB to be generated from the pulsed laser oscillator 51 is set to 50 kHz, and this pulsed laser beam LB is dispersively applied to the five electrode pads 12a1 to 12a5 arranged in a line, thereby forming five fine holes 16 respectively reaching the five electrode pads 12a1 to 12a5. Accordingly, the time intervals of the laser beam LB to be applied to the same fine hole 16 are set to 0.1 ms. However, this configuration is merely illustrative. As a modification, the number of electrode pads to be dispersively irradiated with the laser beam LB may be adjusted according to the repetition frequency. As another modification, the repetition frequency of the pulsed laser beam LB to be generated from the pulsed laser oscillator 51 may be set to 10 kHz or less and the dispersive application of the laser beam LB may not be performed. Also in this case, the time intervals of the laser beam LB to be applied to each electrode pad 12a can be set to 0.1 ms or more.

As another modification, the repetition frequency of the pulsed laser beam LB to be generated from the pulsed laser oscillator 51 may be set to 50 kHz, and the second acoustooptic deflecting means 55 may be suitably controlled to absorb (skip) the unrequired laser beam LB' to the laser beam absorbing means 57 as in the above tests. In this case, the time intervals of the laser beam LB to be applied to the same fine hole 16 can be set to 0.1 ms or more without performing the dispersive application of the laser beam LB described above.

While the substrate 10 is formed of lithium tantalate in the above preferred embodiment, the present invention is not limited to this configuration and the substrate 10 may be formed of any other materials such as silicon, lithium niobate (LN), and glass. In this case, the wavelength of the first plasma light changes according to the material forming the substrate 10. Accordingly, the transmission wavelength of the beam splitter 72 and the passband of the first bandpass filter 73 are adjusted according to the change in wavelength of the first plasma light. Further, while each electrode pad 12*a* is formed of copper in the above preferred embodiment as generally adopted, the present invention is not limited to this configuration and each electrode pad 12*a* may be formed of any other materials such as gold. In this case, the passband of the second bandpass filter 76 may be adjusted according to the change in wavelength of the second plasma light.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method for processing a substrate by using a pulsed laser beam, the substrate having a front side and a back side, a device having an electrode pad being formed on the front side of the substrate, the pulsed laser beam being applied to the back side of the substrate to thereby form a fine hole reaching the electrode pad, the laser processing method comprising:
    a laser beam applying step of applying the pulsed laser beam to the back side of the substrate at a position corresponding to the electrode pad, thereby forming the fine hole in the substrate;
    a detecting step of detecting first plasma light generated from the substrate by the application of the pulsed laser beam to the substrate and also detecting second plasma light generated from the electrode pad by the application of the pulsed laser beam to the electrode pad; and
    a laser application ending step of stopping the application of the pulsed laser beam when the second plasma light is detected in the detecting step; wherein
    time intervals of the pulsed laser beam to be repeatedly applied to the same fine hole in the laser beam applying step are set to 0.1 ms or more.

2. The laser processing method according to claim 1, wherein
    the time intervals in the laser beam applying step are set to 0.15 ms or more.

\* \* \* \* \*